United States Patent [19]

Mitchell et al.

[11] 3,968,461

[45] July 6, 1976

[54] ACOUSTIC SURFACE-WAVE DEVICES

[75] Inventors: Richard Frank Mitchell, Kingston; David William Parker, Reigate; Bernard David Rapson, Newdigate, all of England

[73] Assignee: U.S. Philips Corporation, New York, N.Y.

[22] Filed: Sept. 3, 1974

[21] Appl. No.: 502,506

[30] Foreign Application Priority Data

Aug. 31, 1973 United Kingdom............... 41024/73

[52] U.S. Cl.................................... 333/72; 310/9.8
[51] Int. Cl.² ..................... H03H 9/20; H03H 9/32
[58] Field of Search............... 333/72, 30 R; 310/9.8

[56] References Cited

UNITED STATES PATENTS

| 3,723,919 | 3/1973 | Adler.................................... 333/72 |
| 3,803,520 | 4/1974 | Bristol et al. ..................... 333/72 X |
| 3,835,422 | 9/1974 | Hartemann........................... 333/72 |
| 3,855,556 | 12/1974 | Hartmann.............................. 333/72 |

Primary Examiner—Paul L. Gensler
Attorney, Agent, or Firm—Frank R. Trifari; Henry I. Steckler

[57] ABSTRACT

A surface wave TV I.F. filter has a transducer with two passbands. Each is unsymmetrical with respect to itself and a mirror image of the other. A second transducer suppresses one of the passbands.

4 Claims, 8 Drawing Figures

ACOUSTIC SURFACE-WAVE DEVICES

This invention relates to acoustic surface-wave devices.

The use of acoustic surface waves has enabled devices, such as frequency-selective filters, to be manufactured which are small, compact and are moreover compatible with integrated circuit manufacturing techniques. Such devices enable difficulties such as the bulk and manufacturing cost associated with the provision of inductors to be avoided.

An acoustic surface-wave filter is commonly formed by a thin wafer of piezoelectric material on one surface of which a launching and a receiving transducer are arranged respectively to launch and to receive an acoustic surface wave propagating over the surface. Each transducer normally comprises an interdigital array of strip electrodes, the arrays being formed, for example, by a photo-lithographic proceess from a layer of a suitable metal deposited on the surface of the wafer.

The frequency response of the filter is determined by the number, spacing and dimensional configuration of the electrodes making up each transducer. For convenience of computation, a mathematical model of the array is considered in which each electrode is regarded as representing an individual acoustic surface-wave source and the results obtained from this model are found to be generally satisfactory in practice for design purposes. By employing techniques of Fourier synthesis and computer optimization on this mathematical model, a suitable relative distribution of magnitude and spacing of such sources in the launching and receiving transducer arrays can be calculated which can provide an approximation to a desired band-pass response.

Some aspects of the above-mentioned known design technique will now be described in more detail with reference to FIGS. 1 to 3 of the accompanying drawings.

Figure 1:
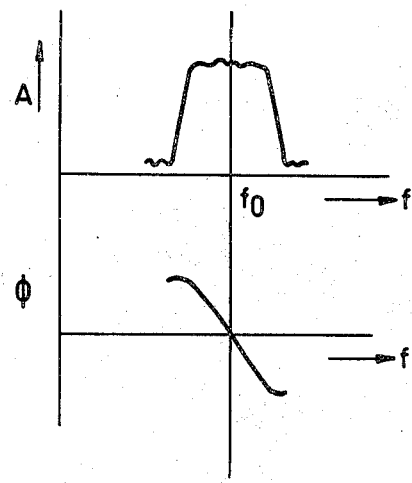
FIG. 1 is a typical bandpass response.

Referring now to FIG. 1, there is shown a bandpass response in which the variation of amplitude A with respect to frequency $f$ is symmetrical about a center frequency $f_o$, and the variation of phase $\phi$ with respect to frequency $f$ is linear about the same center frequency $f_o$. This frequency response corresponds to a Hermitian function, that is to say a function whose real part is symmetrical about the origin and whose imaginary part is antisymmetrical. The amplitude response shown in FIG. 1 corresponds to the modulus of the Hermitian function, and the phase response shown in FIG. 1 corresponds to the tangent $^{-1}$ (imaginary part/real part) of the Hermitian function.

The Fourier transform of a Hermitian function is real, and so represents a continuous distribution with respect to distance over a transducer of the strength of acoustic sources, all having the same phase, which would launch a travelling acoustic surface wave whose signal corresponds to the frequency response of FIG. 1.

Figure 2:
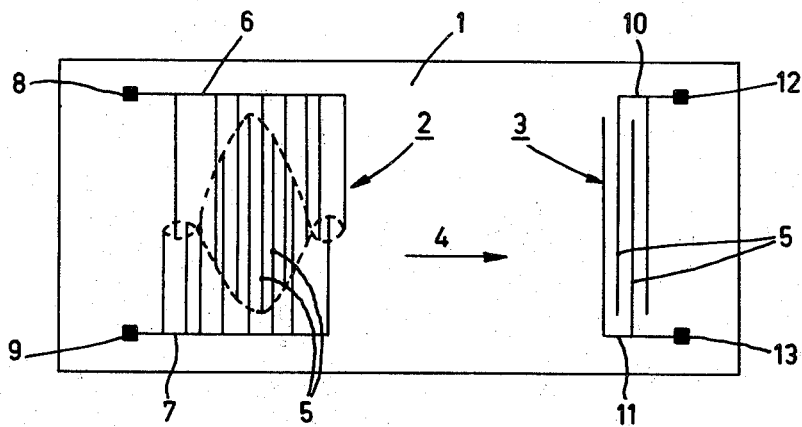
FIG. 2 is a prior art surface wave filter.

FIG. 2 shows schematically in plan view an acoustic surface-wave band-pass filter whose design is derived from the Fourier transform corresponding to the response of FIG. 1. A wafer 1 of piezoelectric material has applied to its upper surface a launching transducer 2 and a receiving transducer 3. The transducers comprise arrays of interdigital electrodes formed on the surface of the body 1, suitably by photo-lithography from a vapor-deposited layer of metal.

The launching transducer 2 is a single-section interdigital electrode array adapted to direct acoustic surface waves at the receiving transducer 3, parallel to the line of acoustic surface-wave propagation 4. The receiving transducer 3 is also a single-section interdigital electrode array and is adapted to receive the acoustic surface waves launched by the transducer 2. Each of the arrays 2 and 3 can be designed with the equivalent source strength at the position of each strip electrode 5 predetermined by adjusting the amount of overlap between that electrode and the two adjacent electrodes of opposite polarity.

Parallel conductive strips 6, 7 connect together ends of fingers 5 of the same polarity and lead to respective input terminals 8, 9 of the launching transducer 2. Parallel strips 10, 11 connect together ends of fingers 5 of the same polarity and lead to respective output terminals 12, 13 of the receiving transducer 3.

Figure 3:
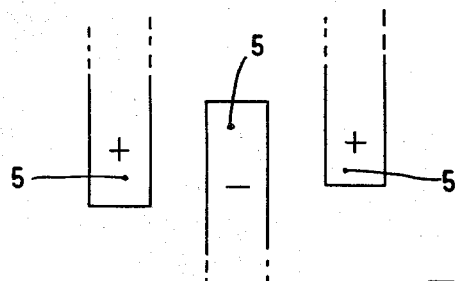
FIG. 3 shows in detail part of the transducers in FIG. 2.
Figure 3:
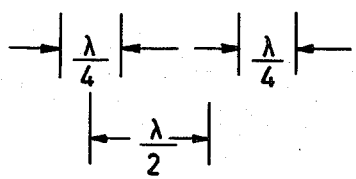

FIG. 3 shows in detail the width and spacing of successive electrodes 5 in both the transducers 2 and 3 shown in FIG. 2. The electrodes 5 are spaced at half a wavelength, $\lambda/2$, of acoustic surface waves on the wafer 1 corresponding to the frequency $f_o$ which is the center frequency of the response shown in FIG. 1. The width of electrodes 5 is the same as the gaps between them and is a quarter wavelength, $\lambda/4$, at the frequency $f_o$.

Referring now to both FIGS. 2 and 3, the electrodes 5 of the transducer 2 act as acoustic sources of alternating sign, that is to say positive voltage is applied to terminal 8 when negative voltage is applied to terminal 9 and vice-versa, and their strengths correspond to samples at regular intervals of the Fourier transform corresponding to the response of FIG. 1. The approximate shape of the envelope of the overlaps which determine these strengths is shown in dotted outline in FIG. 2.

The transducer 2 shown in FIG. 2 will launch an acoustic surface wave having a frequency response as shown in FIG. 1. Considering the source sample formed by each electrode as being on a line through the center of the electrode, the transducer 2 will also launch acoustic surface waves at harmonic intervals whose spacing is determined by the separation of the line samples. A separation of $\lambda/2$ at $f_o$ will result in a repeat at the odd harmonic intervals $3f_o$, $5f_o$, $7f_o$, etc. Compared with the frequency response shown in FIG. 1, the frequency response of these repeats will be identical as regards amplitude but will alternate in phase by 180° for each repeat. However, due to the finite width of each electrode, the electrodes behave individually as distributed sources of sound having a frequency response which is a function of the ratio of the width of the electrodes to the gaps between them. In the particular case of the arrangement shown in FIGS. 2 and 3, that is to say a width-to-gap ratio of 1 to 1 with the electrodes being of alternating sign, then the frequency response of the individual electrodes is substantially zero at the third harmonic $3f_o$. The frequency response of the transducer 2 is thus the product of the frequency response of the distributed line sources and the frequency response of the individual electrodes considered as distributed sources, and this product results in a substantially zero response at the frequency $3f_o$. The reason for choosing this arrangement so as to give a substantially zero response at the frequency $3f_o$ is because this is convenient when it is only the bandpass frequency response about frequency $f_o$ which is required from the acoustic surface-wave device. It can usually be arranged that the external electrical circuits associated with the acoustic surface-wave device do not respond to the fifth and higher harmonic response of the device.

As described above, the launcher transducer 2 is made to have the frequency response shown in FIG. 1. The frequency response of the device shown in FIG. 2 is actually the combined response of the launcher transducer 2 and the receiver transducer 3. In the simple case as shown in FIG. 2 the receiver transducer 3 is designed as a distribution of source samples (or rather detector samples) of equal strength, i.e., the transducer 3 is unweighted and has a broad band-pass response about the frequency $f_o$. The response of the device is in this case the simple product of the two transducer responses, which is substantially the response of the launcher transducer 2. It should be mentioned that the response of the device will be exactly the same if instead the transducer 3 is operated as a launcher and the transducer 2 is operated as a receiver.

A limitation inherent in acoustic surface-wave devices designed as described above with reference to FIGS. 1 to 3 is that the transducers have a frequency response corresponding to a Hermitian function. If a transducer is required whose amplitude-frequency response and/or whose phase-frequency response is such as to make the total frequency response correspond to a non-Hermitian function, then it will be appreciated that, since the Fourier transform of a non-Hermitian function is complex, this means that each of the source samples is specified individually in terms of phase as well as strength. It will be appreciated that this is not possible with the transducers as shown in FIGS. 2 and 3 where all the electrodes 5 connected to the same terminal 8, 9, 12 or 13 are at a spacing of one wavelength and hence are sources (or detectors) which have the same phase.

A known example of a device whose required response corresponds to a non-Hermitian function is a television intermediate-frequency filter having an asymmetrical amplitude response and a linear phase response. Two possible methods which can be tried to produce such a filter are as follows. Firstly, electrical tuning elements can be connected to a Hermitian acoustic surface-wave device. However, this adds to the complexity and cost of the filter. Secondly, the positions of the electrodes of an otherwise Hermitian acoustic surface-wave device can be individually adjusted. This is to say that if an electrode is displaced from the position defined in the arrangement shown in FIGS. 2 and 3, then this is equivalent to having a source at that defined position but with a certain phase at the fundamental frequency $f_o$. However, the phase produced by this displacement will vary over the range of frequencies of the required pass-band, and in practice this makes it very difficult to arrive at the required non-Hermitian frequency response of the acoustic surface-wave device by a systematic adjustment of the positions of the electrodes.

An object of the present invention is to provide an acoustic surface-wave device with a transducer having a frequency response about a frequency $f_o$ which corresponds to a non-Hermitian function, by means alternative to those described in the preceding paragraph.

According to the present invention there is provided an acoustic surface-wave device including a body of piezoelectric material on one surface of which is formed a launching or receiving transducer including an interdigital array of electrodes, in which the electrodes of the array are spaced at half a wavelength of acoustic surface waves corresponding to a frequency $f_o + x$, and in which the electrodes of the array are arranged such that components of the frequency response of the array about the frequencies $f_o$ and $f_o + 2x$ together correspond to a Hermitian function about the frequency $f_o + x$ but individually correspond to a non-Hermitian function.

According to the invention there is further provided an acoustic surface-wave device including a body of piezoelectric material on one surface of which is formed a launching or receiving transducer including an interdigital array of electrodes, in which all the electrodes of the array are spaced at half a wavelength of acoustic surface waves corresponding to a frequency $2f_o$, in which at least some of the electrodes are arranged in pairs with the two electrodes of each pair electrically connected in common, and in which, for at least some of the pairs of electrodes, the overlap with electrodes adjacent to that pair is different for the two electrodes of the pair, whereby components of the frequency response of the array about the frequencies $f_o$ and $3f_o$ together correspond to a Hermitian function about the frequency $2f_o$ but individually correspond to a non-Hermitian function.

According to the invention there is further provided an acoustic surface-wave device as described in the previous paragraph, and in which on said surface there is formed another transducer which includes an interdigital array of electrodes spaced at half a wavelength of acoustic surface waves corresponding to the frequency $f_o$ and having the same width as the gaps between them, whereby the component of the combined frequency response of the two transducers about the frequency $3f_o$ is suppressed.

In a paper entitled "Applications of double electrodes in acoustic surface wave device design" by T.W. Bristol et al., presented to the Proc. IEEE Ultrasonics Symposium, Oct. 1972, it is said that "One of the principal factors which limits the performance of conventional surface wave devices is the additive surface wave reflections and bulk wave scattering from acoustic wave impedance discontinuities due to the interdigital transducer electrodes. It has been shown that by dividing each electrode into a split pair, the reflections cancel and scattering into bulk waves is eliminated, since the periodicity of the discontinuities is doubled. Further investigations have shown that double electrodes couple to both the fundamental and third harmonic modes with essentially equal strength, while retaining the inherent reflection and bulk wave scattering suppression for both modes." However, in this paper the problem of obtaining non-Hermitian responses is not considered. In fact the transducer geometry illustrated shows the electrodes all arranged in pairs with the electrodes of each pair being of equal strength which would necessarily result, as will be explained in more detail later, in a Hermitian response about both the fundamental and third harmonic frequencies. The adoption of the transducer array geometry according to the present invention can, incidentally, result in some reduction of spurious signals due to inherent reflections and bulk wave scattering by the electrode structure.

The present invention will now be described in more detail with reference to FIGS. 4 to 8 of the accompanying drawings.

Figure 4:
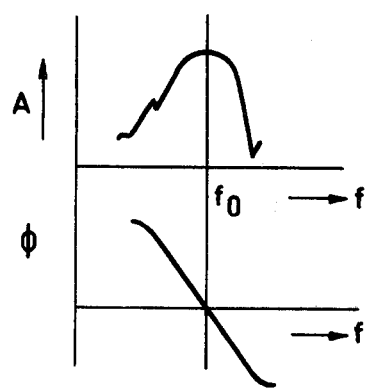
FIG. 4 shows a required band-pass response of a television intermediate frequency filter.

Referring now to FIG. 4, there is shown a bandpass response in which the variation of amplitude A with respect to frequency $f$ is asymmetrical about a center frequency $f_o$, and the variation of phase $\phi$ with respect to frequency $f$ is linear about the same center frequency $f_o$. This frequency response is a required bandpass response of a television intermediate frequency filter and corresponds to a non-Hermitian function.

Figure 5:
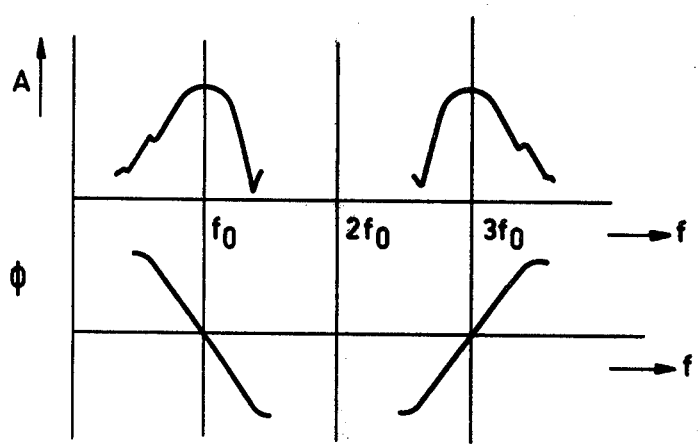
FIG. 5 shows a frequency response corresponding to a Hermitian function about a frequency $2f_o$.

Referring now to FIG. 5, there is shown a band-pass response about a center frequency $f_o$ which is the same as that shown in FIG. 4 and a band-pass response about a center frequency $3f_o$ which is the mirror image about $2f_o$ of that about $f_o$. Thus the frequency response components about the frequencies $f_o$ and $3f_o$ together correspond to a Hermitian function about frequency $2f_o$ but individually correspond to a non-Hermitian function.

The Fourier transform of a Hermitian function is real, and so represents a continuous distribution with respect to distance over a transducer of the strength of acoustic sources, all having the same phase, which would launch a travelling acoustic surface wave whose signal corresponds to the frequency response of FIG. 5.

Figure 6:
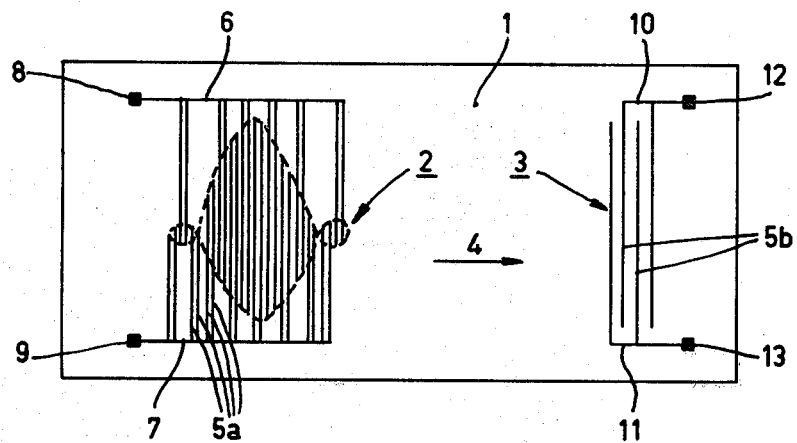
FIG. 6 shows schematically in plan view an acoustic surface-wave band-pass filter having two transducers, the design of one of which is derived from the Fourier transform of the Hermitian function corresponding to the frequency response shown in FIG. 5.

FIG. 6 shows schematically in plan view an acoustic surface-wave band-pass filter whose design is derived from the Fourier transform corresponding to the response of FIG. 5. The same reference numerals as used in FIG. 2 will be used where appropriate. A wafer 1 of piezoelectric material has applied to its upper surface a launching transducer 2 and a receiving transducer 3. The transducers comprise interdigital electrode arrays formed on the surface of the body 1, suitably by photo-lithography from a vapor-deposited layer of metal.

The launching transducer 2 is a single-section interdigital electrode array adapted to direct acoustic surface waves at the receiving transducer 3, parallel to the line of acoustic surface-wave propagation 4. The receiving transducer 3 is also a single-section interdigital electrode array and is adapted to receive the acoustic surface waves launched by the transducer 2. Each of the arrays 2 and 3 can be designed with the equivalent source strength at the position of each strip electrode 5a or 5b predetermined by adjusting the amount of overlap between that electrode and the electrodes of opposite polarity which are nearest to it.

Parallel conductive strips 6, 7 and connect together ends of fingers 5a of the same polarity and lead to respective input terminals 8, 9 of the launching transducer 2. Parallel strips 10, 11 connect together ends of fingers 5b of the same polarity and lead to respective output terminals 12, 13 of the receiving transducer 3.

The transducer 2 as shown in FIG. 6 will launch an acoustic surface wave having a frequency response centered about the frequency $2f_o$ as shown in FIG. 5, and also waves having identical amplitude response but alternating in phase by 180° centered about the harmonic frequencies $6f_o$, $10f_o$, $14f_o$ etc.

The electrodes $5a$ of the transducer 2 act as acoustic sources whose strengths correspond to samples at regular intervals of the Fourier transform of the response shown in FIG. 5. The approximate shape of the envelope of the overlaps which determine these strengths is shown in dotted outline in FIG. 6.

Figures 7, 8:
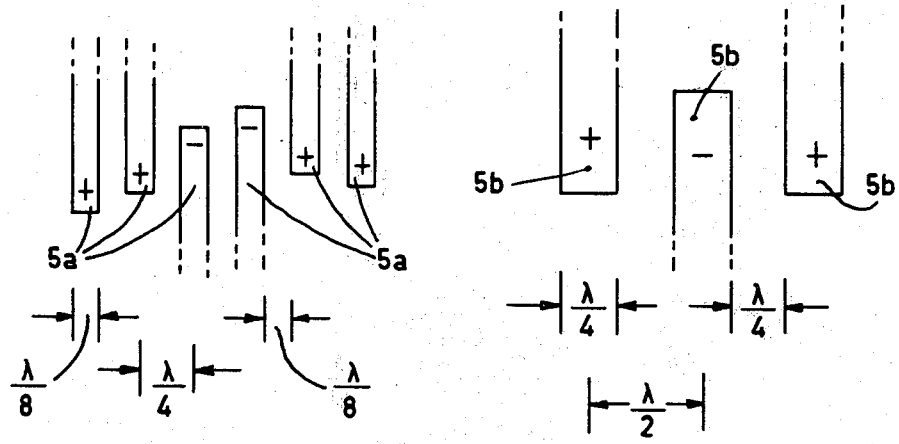
FIG. 7 shows in detail part of one of the transducers shown in FIG. 6.
FIG. 8 shows in detail part of the other transducer shown in FIG. 6.

FIG. 7 shows in detail the width and spacing of successive electrodes $5a$ in the transducer 2 shown in FIG. 6.

The electrodes $5a$ are spaced at half a wavelength of acoustic surface waves on the wafer 1 corresponding to the frequency $2f_o$, which ensures a frequency response centered about the frequency $2f_o$. This spacing is equivalent to a quarter wavelength, $\lambda/4$, at the frequency $f_o$. At least some of the electrodes $5a$ are arranged as shown in FIG. 7 in pairs with the two electrodes $5a$ of each pair being electrically connected in common, which ensures the separation of the components of the response at $f_o$ and $3f_o$. For at least some of the pairs of electrodes $5a$, the electrodes of the pair are of unequal length. More precisely, the overlap with electrodes adjacent to that pair is different for the two electrodes of the pair, which enables the components of the response about the frequencies $f_o$ and $3f_o$ the individually correspond to a non-Hermitian function. The unequal lengths of the electrodes of a pair is vital in providing an extra degree of freedom which can be employed in the synthesis of the frequency response of the transducer 2 compared with an interdigital array without any such pairs of electrodes. This may be appreciated by considering that if the two electrodes of each pair were of the same length then their effect would be substantially the same as a single broad electrode of that length, in which case the components of the frequency response at $f_o$ and $3f_o$ would be Hermitian. The width of the electrodes $5a$ shown in FIG. 7 is the same as the spacing between them, that is an eighth of a wavelength, $\lambda/8$, at the frequency $f_o$. This is chosen simply for ease of fabrication, since very narrow electrodes or very narrow gaps would be more difficult to make by photo-lithography.

FIG. 8 shows in detail the width and spacing of successive electrodes $5b$ in the receiving transducer 3 shown in FIG. 6. The electrodes $5b$ are spaced at half a wavelength, $\lambda/2$, of acoustic surface waves on the wafer 1 corresponding to the frequency $f_o$, they are of alternating sign, and the width of the electrodes $5b$ is the same as the gap between them, i.e., a quarter wavelength, $\lambda/4$, at $f$. Moreover, the electrodes $5b$ are of equal length. The frequency response of the transducer 3 is therefore a broad-band Hermitian response centered about the frequency $f_o$, and repeated at odd harmonic intervals except for the 3rd harmonic $3f_o$ where the response is substantially zero.

The frequency response of the acoustic surface-wave device shown in FIG. 6, which is the combined response of the transducers 2 and 3, is thus the simple product of the two transducer responses which is substantially the response of the launcher transducer 2 with the component about the frequency $3f_o$ suppressed. Thus the frequency response of the device shown in FIG. 6 is the required asymmetric amplitude linear phase response shown in FIG. 4. It should be mentioned that the response of the device will be exactly the same if instead the transducer 3 is operated as a launcher and the transducer 2 is operated as a receiver.

The exact form of the transducer 3 shown in FIGS. 6 and 8 is not essential to the invention. For example, if required it could be weighted, in which case the combined response of the two transducers would not necessarily be just the simple product and so synthesis of the design would be more complicated. Such weighting of the transducer 3 could be length weighting or, if suppression of the third harmonic was not required, width weighting. Transducer 3 could even be designed to include double electrodes of unequal length in the same manner as transducer 2.

The acoustic surface-wave device described above with reference to FIGS. 5 to 8 is one example of a device including a transducer with a frequency response corresponding to a non-Hermitian function about a center frequency $f_o$, that is to say that the transducer has an amplitude-frequency response which is asymmetric and a phase-frequency response which is linear. There are, however, other categories of frequency response corresponding to a non-Hermitian function and these can also be embodied in transducers forming part of acoustic surface-wave devices according to the invention; for example, a frequency response which is asymmetric in amplitude and non-linear in phase. An example where this response is required is a television intermediate frequency filter which must cancel a predetermined non-linearity of phase which is present in a transmitted signal.

Furthermore it is not absolutely necessary, in order to design a transducer with a frequency response corresponding to a non-Hermitian function about a center frequency $f_o$, to base the design on a response which corresponds to a Hermitian function about a center frequency $2f_o$. The design could be based on a response corresponding to a Hermitian function about a center frequency $f_o + x$ with non-Hermitian components about the frequencies $f_o$ and $f_o + 2x$. Where $f_o x$ is less than $2f_o$ this means that the spacing of the electrodes at half a wavelength corresponding to $f_o + x$ will be correspondingly greater, which makes fabrication easier. Such a transducer would probably not have the electrodes grouped in pairs to the same extent as the transducer 2 shown in FIG. 6.

What is claimed is:

1. An acoustic surface wave device comprising a body of piezoelectric material, a transducer disposed on a surface of said body and including an interdigital array of parallel electrodes, said electrodes having a dimension according to the Fourier transform of a function which corresponds to a predetermined frequency response of the array, said predetermined response including a non-symmetrical passband amplitude-frequency response about a frequency $f_o$, a non-symmetrical passband amplitude-frequency response about a frequency $f_o + 2x$ which is the mirror image of the amplitude-frequency response about the frequency $f_o$, wherein $x$ is a selected constant and $f_o$ is a selected frequency, and a stopband extending between the two passbands about $f_o$ and $f_o + 2x$, each electrode of the array being spaced from its adjacent electrodes at half a wavelength of acoustic surface waves corresponding to the frequency $f_o + x$, at least some pairs of immediately adjacent electrodes being electrically connected in common, and for at least some of the said pairs of immediately adjacent electrodes which are electrically connected in common, the two electrodes of those pairs being of unequal length.

2. A device as claimed in claim 1 wherein said dimension comprises length.

3. An acoustic surface wave device as claimed in claim 1, wherein $x = f_o$.

4. An acoustic surface-wave device as claimed in claim 3, further comprising another transducer disposed on said surface which includes an interdigital array of electrodes spaced at half a wavelength of acoustic surface waves corresponding to the frequency $f_o$ and having the same width as the gaps between them, whereby the component of the combined frequency response of the two transducers about the frequency $3f_o$ is suppressed.

* * * * *